United States Patent [19]

Wirz et al.

[11] Patent Number: 4,895,631
[45] Date of Patent: Jan. 23, 1990

[54] PROCESS AND APPARATUS FOR CONTROLLING THE REACTIVE DEPOSIT OF COATINGS ON SUBSTRATES BY MEANS OF MAGNETRON CATHODES

[75] Inventors: Peter Wirz, Waldernbach; Friedrich-Werner Thomas, Gelnhausen, both of Fed. Rep. of Germany

[73] Assignee: Leybold Aktiengesellschaft, Hanau I, Fed. Rep. of Germany

[21] Appl. No.: 326,404

[22] Filed: Mar. 20, 1989

Related U.S. Application Data

[63] Continuation of Ser. No. 59,559, Jun. 8, 1987, abandoned.

[30] Foreign Application Priority Data

Mar. 20, 1987 [DE] Fed. Rep. of Germany ....... 3709177

[51] Int. Cl.[4] ............................................. C23C 14/34
[52] U.S. Cl. ........................... 204/192.13; 204/192.12; 204/298
[58] Field of Search ...................... 204/192.12, 192.13, 204/192.33, 298 MT, 298 GF, 298 ME, 298 SC, 298 ET

[56] References Cited

U.S. PATENT DOCUMENTS

| 4,166,784 | 9/1979 | Chapin et al. | 204/298 X |
| 4,362,936 | 12/1982 | Hoffmann et al. | 204/298 X |
| 4,407,709 | 10/1983 | Enjouji et al. | 204/298 X |
| 4,428,811 | 1/1984 | Sproul et al. | 204/298 X |

Primary Examiner—Nam X. Nguyen
Attorney, Agent, or Firm—Felfe & Lynch

[57] ABSTRACT

A reaction gas is admitted in the immediate vicinity of a target on the cathode and a plasma is generated between the target and a substrate to be coated. The intensity of the spectral line of a target material is measured, and is used to provide a first signal with a relatively short time constant to a controller via a first control circuit. A property of the finished coating is sensed after the substrate leaves the coating zone, and is used to provide a second signal with a relatively long time constant to the controller via a second control circuit. The controller uses the combined signals to regulate the admission of the reaction gas so that a pre-established property of the finished coating is kept substantially constant.

10 Claims, 1 Drawing Sheet

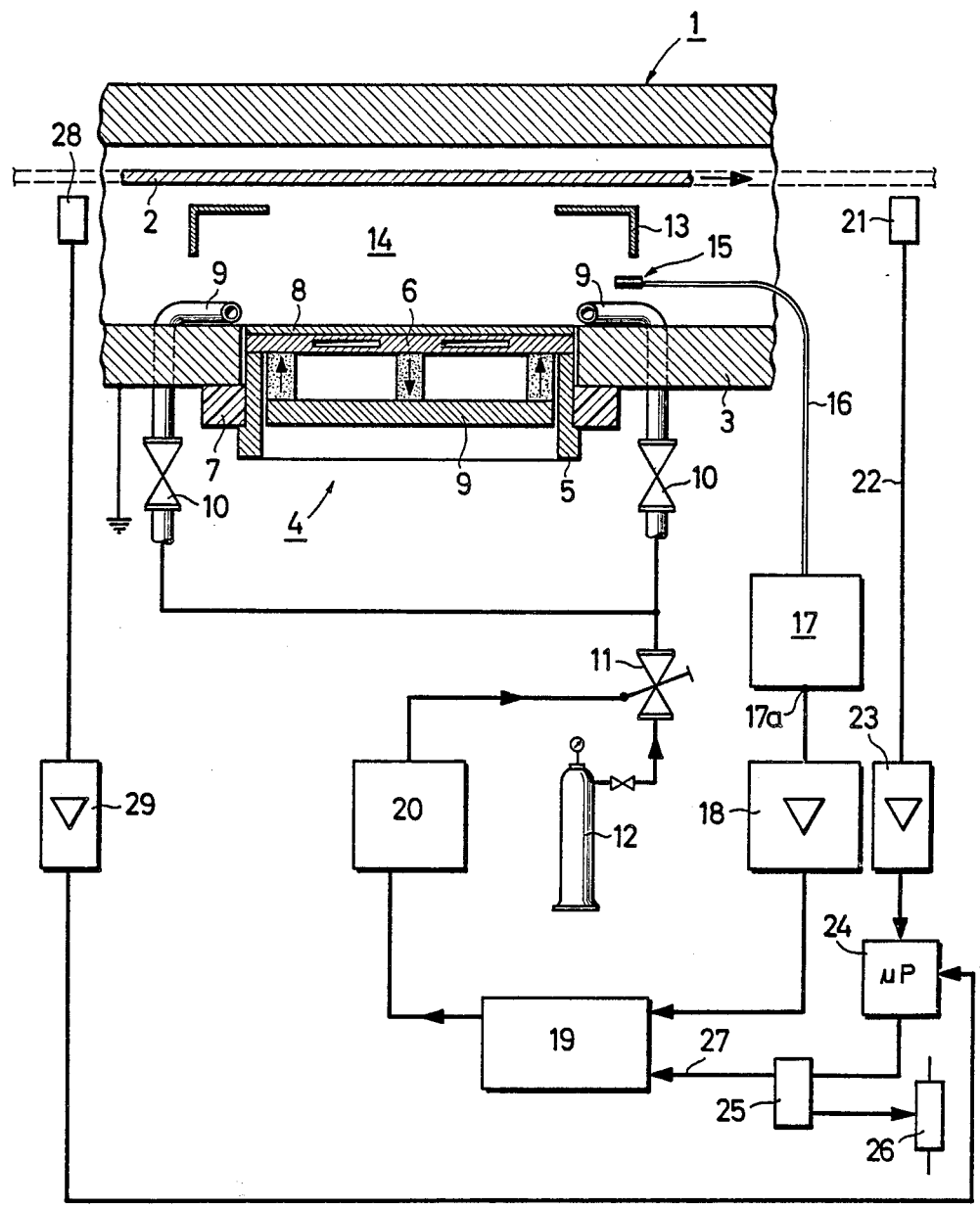

PROCESS AND APPARATUS FOR CONTROLLING THE REACTIVE DEPOSIT OF COATINGS ON SUBSTRATES BY MEANS OF MAGNETRON CATHODES

This application is a continuation, of application Ser. No. 059,559, filed Jun. 8, 1987 abondoned.

BACKGROUND OF THE INVENTION

The invention relates to a process for controlling the reactive deposit of a coating on a substrate with a magnetron cathode operated at constant power and a target having an electrically conductive component of the coating material. The process includes measuring the intensity of at least one spectral line of the target material in the plasma of a sputtering process, and admitting reaction gas in the vicinity of the target according to this intensity. PROCESS AND APPARATUS FOR CONTROLLING THE REACTIVE DEPOSIT OF COATINGS ON SUBSTRATES BY MEANS OF MAGNETRON CATHODES The invention relates to a controlling process according to the general part of claim 1.

In such coating processes, an electrically conductive target, usually a metal target, is sputtered in a reactive atmosphere so that the magnetron cathode can be supplied with direct current. A coating of the reaction product of the target material then deposits itself on the substrate, and the composition of the coating material depends very greatly on the atmosphere surrounding the magnetron cathode.

In this kind of coating process, three different modes of operation of the magnetron cathode are distinguished, namely the "metallic mode," "reactive mode," and "transitional mode." In the "metallic mode" the sputtering surface of the target is of a metallic, i.e., conductive character. In the "reactive mode" a corresponding reaction product is found on the sputtering surface of the target, and, as a rule, it is an electrical insulator, and the sputtering rate, i.e., the amount of target material sputtered per unit time, is considerably reduced. The "transitional mode" is between these two operating modes and is considered to be unstable to a very great extent, because it threatens to tilt in the one or in the other direction. This "transitional mode" is a peculiarity typical of magnetron cathodes, in which an erosion pit forms due to the locally restricted sputtering process, and becomes increasingly deeper. While the walls of the erosion pit can still be kept very largely free of reaction products, the rest of the target surface becomes coated with the reaction products, and thus produces the unstable operating behavior previously described.

In order to prevent or suppress this unstable operation insofar as possible, it is already known to feed the reaction gas in at a point that is remote from the target surface and shielded by a mask, and to feed into the vicinity of the target an inert gas which produces the sputtering (DE-OS 33 31 707). If, when employing such a measure, the feeding of the reaction gas is performed according to the intensity of one or more spectral lines, the result would be time constants that are extraordinarily long for such a control method, and which are unacceptable in a production process, especially a continuous production process. Moreover, in such a case a slow alternation takes place between the "metallic mode" and the "reactive mode" especially because the breakdown of the reaction product on the sputtering surface of the target takes, relatively, a very long time on account of the sputtering rate which in this case is very low.

It has already been recognized that this alternation between the "metallic mode" and the "reactive mode" can be expressed by a hysteresis curve if the reaction gas flow exceeding the stoichiometric ratio is plotted over the reaction gas flow (EP-OS 0 121 019), to which U.S. Pat. No. 4,428,811 corresponds. Even a control process founded on this relationship and using a mass spectrometer does not lead to the elimination of the instability problems, because the time constants of the individual components of the measuring and control circuit are too long.

In reactive coating processes the object is, as a rule, to produce a chemical compound having the required coating properties. These coating properties are to be produced within close tolerances and with great long term stability. A whole series of proposals have been made for regulating a parameter of the process of magnetron sputtering by means of control circuits having a sensor for detecting a particular coating property. All proposals, however, have led to only very limited success. This is because many coating properties cannot be measured in the coating zone, or they can be measured only very imprecisely due to the effect of the plasma on the measuring signals. In such control circuits, therefore, the measurement has always been performed outside of the coating zone. An obstacle to the achievement of close tolerances in this kind of procedure is the time difference between the end of the coating process and the measurement. Since the time constant has to be made substantially greater than this time difference, in the interest of the stability of the control circuit, the result is large substrate areas which fail to be coated within the tolerances. These substrate areas can extend over several of the substrates or, in the case of film coating, over great lengths of the film, which consequently have to be considered as rejects.

Still more important than the disadvantages cited above of using the measured value of a property of the coating for control purposes is the disadvantage that such control circuits do not guarantee the stability of the reactive coating process. Causes of such instabilities are, for example, undesired changes in the gas composition, and arc discharges at the target which express themselves in variations in the properties of the deposited coatings. Such instabilities can tilt the process away from the "metallic mode" to the "reactive mode." Such a tilt during the coating of the substrate signifies complete rejection as far as the coating properties are concerned.

This so-called "tilting" occurs at a critical flow of the reaction gas, under otherwise constant electrical sputtering parameters. This rate is a measure of the basic stability of the reactive process. If the reaction gas flow is less than the critical flow, the magnetron cathode operates in the so-called "metallic range" in which the discharge can be stabilized by very simple means. In this range of operation the required coating processes are generally achieved by keeping such process parameters as power and reaction gas flow constant, and by timing.

On the other hand, in the "metallic range" it is generally impossible to deposit coatings of reaction products with the required stoichiometry. By taking special measures to eliminate the influence of the reaction gas on the target or on the substrate, such coatings can be produced at correspondingly lower rates (see, for example, the previously mentioned DE-OS 33 31 707).

In the procedures described above for the attainment of the required coating properties, the reaction gas flow and/or an electrical working parameter have been either kept constant or controlled.

In controlling the process on the basis of a measured property of the coating, however, not only is the previously mentioned time interval between the end of the coating and the measurement disadvantageous, but also the time lag in the covering of the target is even more critical. Necessary changes in the covering of the target, which occur for example in the case of a change in the power, can bring about a time lag that is greater than the above-mentioned time interval resulting from the location of the point of measurement of the coating parameters. This time shift can amount to between several seconds and several minutes, so that unacceptable changes in the coating process are the consequence.

For economical reasons, coatings generally can be achieved with a high reactivity of the compound and high rates of deposition only in the so-called "transitional mode," which is an unstable or metastable state of operation of the sputtering process, which has been referred to above. In the erosion pit in the target, coating with reaction products is just barely prevented, while the reaction products are deposited on the substrate with a high reactivity and at high rates. Working in the "transitional mode" requires the stabilization of the discharge by additional means.

U.S. Pat. No. 4,166,784 discloses a method of regulation by detecting the intensity of a characteristic line of the target material in the plasma. The stabilization of a working point of the reactive discharge is performed by means of a control circuit by which an electrical parameter of the power supply at constant reaction gas flow is regulated on the basis of the intensity signal as the found value, or the reaction gas flow is controlled at constant electrical operating parameters.

Through DD-PS 239,810 it is known to tune light radiation out of a plasma discharge and use a spectral line or group of spectral lines to form a signal for the purpose of regulating the gas flow. DD-PS 239,811 also discloses how a reference signal can be found for fixing the position of the working point.

control circuits for assuring the process stability of a given working point of the discharge in a reactive cathode sputtering process utilizing an emission signal generally cannot prevent the properties of the coating from being out of tolerance and/or from shifting over a long period of time. There are a number of reasons for this:

When new substrate surfaces are brought into the coating area, surface coatings are released by the action of the plasma on the substrate. This causes the gas composition in the discharge, and consequently also the emission signal, to vary in an uncontrollable manner.

Desorption from parts of the apparatus after a target change likewise produces undesired changes in the emission signals. What is critical in this phenomenon is its uncontrollability and the fact that it is present over long periods of time, even for hours.

Furthermore, all geometrical changes during the coating process, especially progressive target erosion, produce unwanted changes in the emission signal.

The problem to which the invention is addressed is to devise a process of the kind described above, whereby it will be possible in a reactive coating process to regulate the coating properties and achieve close tolerances.

SUMMARY OF THE INVENTION

The intensity of the spectral line of the target material is measured in the plasma between the target and the substrate. At least one property of the finished coating is measured and a reference value is produced which is slidingly adjusted in relation to said property. Reaction gas admitted during the build-up of the coating is regulated according to the intensity of the spectral line and the reference value so that a pre-established coating property is kept substantially constant.

It is important that the measurement be performed at least of one spectral line in the plasma between target and substrate. This is an optical measurement, i.e., a measurement made with a spectral photometer aimed directly at the plasma. This means, when a magnetron cathode is used, that the optical sensor must be aimed at elements of volume very close to the target surface. The area in which the measurement is performed parallel to the target surface is preferably about 10 to 30 mm in front of the target surface.

The accuracy of such a measurement also differs decidedly from a measurement performed with a mass spectrometer in which elements of volume of the gas atmosphere are aspirated out of the coating area and analyzed at a point remote therefrom. This method of measurement suffers from a considerable time lag, and furthermore has the disadvantage that the composition of the gas can change along the way.

The regulation of the reaction gas inlet with the shortest possible time constant is to be seen in conjunction with the admission of the reaction gas close to the target. In this manner it is possible to adapt the flow of the reaction gas very quickly to any change in the working conditions.

The measurement of at least one property of the finished coating is performed necessarily with a decidedly longer time constant, because first the substrate with the finished coating has to be transported from the coating zone to the measuring zone. So in this case the adaptation of the reference value is performed at a slower speed. This, however, as experience has shown, is entirely sufficient for the achievement of the object of the invention.

What is involved in principle is the superimposition of two regulating circuits, one of which has an extremely short and the other a markedly longer time constant. By controlling the weighting of the influence of the measured signals on the plasma side, on the one hand, and on the substrate side on the other, the stability of the overall regulating process can be decidedly improved. It is possible, for example, to set the percentage of the measured signal from the plasma at 60 to 90% and the percentage of the measured signal from the substrate measurement at 10 to 40%.

The procedure according to the invention, of achieving a necessary process stability on the one hand and at the same time achieving the necessary constancy of the coating properties on the other, by means based on different principles, has proven to be an extremely effective solution of the stated problem. It has been found that a qualitative improvement of the control of plasma emission for process stabilization is made possible when the time constant of the control circuit in question is kept as short as possible. Reducing the time constants of this control circuit can be achieved, however, only if the time lag in the feeding of the reaction gas is overcome.

Short paths for the diffusion of the reaction gas from the inlet to the area of the dense plasma in the magnetic trap over the erosion profile are assured by admitting the reaction gas as closely as possible to the target. This kind of admission, in which the target area and the substrate are coupled very closely, would result in a drastic reduction of the basic stability of the discharge were it not for continuous variation of the reference value. The close coupling between the inlet of the reaction gas and the target surface is contrary to the standard practice of providing for extensive decoupling between the target and the substrate area in the interest of a high basic stability.

The short time constant, and with it the close feedback of the measurement signal from the plasma, in conjunction with the continuous variation of the preset value, permit stable operation at arbitrarily selected working points in the "transition range." This means in practice the gaining of degrees of liberty in the process, e.g., for the achievement of coatings with a wide range of specifically controllable properties. For example, the index of refraction of aluminum nitride coatings can be varied in a range from 1.95 to 2.1. In the production of indium-tin oxide coatings the specific resistance can be varied by orders of magnitude.

If the coupling created by the plasma emission control between the target area and the substrate area is still further strengthened, coating properties can be achieved which have never before been achieved with means of the prior art. For example, indium-tin oxide coatings are produced on unheated substrates with surface resistances under $1 \times 10^{-4}$ ohms/cm, as compared with $8 \times 10^{-4}$ ohms/cm with prior-art methods.

An explanation as to why the discharge can nevertheless be kept stable in the procedure according to the invention can be seen in the fact that, on account of the close coupling, the percentage of the reaction gas that is reacted to the desired chemical compound relatively increases because the excitation of the reaction gas in the vicinity of the substrate also increases. On the other hand, the close coupling and the basic stability thereby produced has the consequence that changes in the gas composition as a result of desorption processes lead to an intensified effect on the emission signal and hence on the coating properties.

Due to the close coupling of the partial processes at the target on the one hand, and at the substrate on the other, the control process according to the invention makes the influence exercised by the state of erosion of the target (the change in which leads to a shift in the sputtering rate and in the excitation of the reaction gas) on the coating properties become relatively greater. The shift in the coating properties provoked by the two effects, however, has a great time constant and can be effectively prevented by the coupling of the control process according to the invention via the continuous adjustment of the reference value.

Thus, it is especially advantageous that the regulation according to the invention is not performed until after the conditioning of the target surface is completed. By this is meant the cleaning of the surface of a new target or of a target that has been exposed to the ambient air.

In this case it is especially advantageous to proceed, after the conditioning of the target surface is completed, by setting process parameters close to the working point as required for the needed coating properties by programming the timing of the influx of the reaction gas and steadily increasing it within a given adjustment period until a flow of the reaction gas is reached which approximately determines the level to be preset for at least one coating property.

It is then especially advantageous if the value of the at least one intensity signal measured for the flow of the reaction gas at the end of the conditioning period and adjustment period is compared with the reference value for the coating properties. The reference value for the first control circuit is formed on the basis of the comparison.

The emission intensity measured at the end of the conditioning characterizes a defined starting state. The working point in the reactive operation at which the required coating property is achieved is initially identified by a reference intensity value which is determined on the basis of preliminary experiments.

The invention also relates to an apparatus for the performance of the process described above. For the solution of the same problem, this apparatus is characterized in that (a) An optical sensor of a spectral photometer system is aimed at the space between the magnetron cathode and the substrate, the sensor beam path being parallel to the target surface and being disposed very close to the latter, (b) A gas distributing system is disposed close to the target surface and is connected through a control valve to a source of the reaction gas, (c) The output of the spectral photometer system is connected through an amplifier and a controller to an actuator of the control valve, the optical sensor, spectral photometer system, amplifier, controller, actuator and control valve forming a first control circuit with a short time constant, equal to or less than 150 ms and preferably equal to or less than 50 ms, (d) In the path of the substrate coated immediately before, a second sensor for sensing at least one property of the coated substrate is disposed, the output of the second sensor being delivered to a second amplifier whose output is delivered to a reference value generator for the controller, while the second sensor, the second amplifier, the reference value generator, the controller, the actuator and the control valve connected to the output form a second control circuit with a longer time constant than that of the first control circuit, and the first and second control circuits are connected together in the controller.

BRIEF DESCRIPTION OF THE DRAWING

The sole figure is a partial section view of the vacuum chamber, and also schematically shows the apparatus and circuitry for controlling the reactive gas.

DETAILED DESCRIPTION OF THE PREFERRED EMBODIMENT

In the drawing is represented a section of a vacuum chamber 1 through which a substrate 2 is guided along a path of movement which is indicated by broken lines. In a floor plate 3 of the vacuum chamber, surrounded on all sides by an insulating space that is smaller than the dark space to be observed under operating conditions, is a magnetron cathode 4 which consists of the following parts: a basic cathode body 5 with a face plate 6 is inserted into the floor plate 3 with the interposition of a ring 7 of insulating material.

On the upper side of the face plate 6, which is provided with cooling passages, is a target 8 of an electrically conductive material constituting the one component of the coating material. On the bottom of the face plate 6 is a magnet system 9 which consists of a ferromagnetic yoke plate and permanent magnets disposed one inside the other thereon, the inner and outer magnets having opposite polarity, which is indicated by the arrows. In the immediate marginal area of the target 8 is a gas distributing system 9, but, as seen in plan, it comes just short of overlapping the target 8. The gas distributing system 9 consists of one or two tubes which follow the periphery of the target, at least on a large portion of the circumference, and have perforations through which the reaction gas can flow toward the target. The gas distribution system 9 is connected through throttle valves 10 and a common regulating valve 11 to a source 12 of a reaction gas or of a mixture of a reaction gas and a working gas (argon). The voltage source for supplying the magnetron cathode 4 with a negative direct-current voltage between 400 and 1000 volts has been omitted for the sake of simplicity.

Between the magnetron cathode 4 and the substrate 2 a shield system 13 is disposed close to the substrate and can serve also as an anode and can either be at the same potential as the vacuum chamber or at a higher positive potential. The target 8, the substrate 2 and the shield system 13 substantially define a reaction zone 14 in which a reactive process takes place to coat the substrate 2 with a compound of the target material and the reaction gas.

An optical sensor 15 is aimed at a narrow portion of the reaction zone 14 along a beam path running parallel to the target 8. This beam path is situated within a range of 10 to 30 mm above the target 8. From the optical sensor 15 a glass fiber cable 16 leads to a spectral photometer system 17 which can consist, for example, of an optoelectronic converter with interference filters or of a controllable monochromator. In this manner it is possible to select from the light signal from the sensor 15 one or more spectral lines and analyze them for their intensity. At the output 17a of the spectral photometer system, therefore, an electrical signal appears which is proportional to the intensity of the spectral line or lines.

To the output of the spectral photometer system is connected an amplifier 18 which is in turn followed by a controller 19 which acts upon an actuator 20 that operates the control valve 11. This system forms a first regulating circuit with an extremely short time constant that is less than 150 ms. The composition of the gas atmosphere and of the plasma in the reaction zone 14 can therefore be adjusted very rapidly.

In the path of the substrate 2, after the exit from the reaction zone 14, there is a second sensor 21, which can be an optical and/or an electrical sensor depending on the coating property that is to be measured. The output signal from this sensor is fed through a line 22 to an additional amplifier 23 whose output is in turn connected to a microprocessor 24. From this microprocessor another line leads to a reference level generator 25 which is preset by an adjusting means 26 (potentiometer). Since the sensor 21 registers certain changes in the coating properties on the substrate 2, the result is that, at the output of the reference level generator 25, a so-called sliding reference value is present which is fed through a line 27 to the controller 19. In the controller 19, consequently, signals corresponding to the output signals of the sensors 15 and 21 are combined for the exercise of control. Since the properties of the finished coating cannot be determined by the sensor 21 without a time lag corresponding to the velocity of movement of the substrate 2, the signal corresponding to the coating properties is produced with a time delay which is great in comparison to the time constant of the first control circuit. As a rule the lag will amount to at least 0.5 second. The elements from the sensor 21 through the reference value generator 25 to the control valve 11 constitute a second control circuit with a large time constant, parts of the first and second control circuit after the controller 19 being identical.

Furthermore, in the path of the substrate 2 just ahead of the coating station formed by the magnetron cathode 4 with the reaction zone 14, a third sensor 28 is disposed for detecting the properties of the substrate entering the coating station, which is connected through a third amplifier 29 to the microprocessor 24. In the microprocessor 24 the signals of the sensors 21 and 28 are compared, so that only changes in the properties of the substrate in the coating station occurring within the reaction zone 14 are determined. This measure is important for the case, among others, that the coating station with the reaction zone 14 is preceded by another coating station, so that the substrate enters the reaction zone 14 with one or more previous coatings.

We claim:

1. Process for controlling the reactive deposit of a coating on a substrate using a magnetron cathode operated at constant power and having a target with an electrically conductive component of the coating material, said method comprising the steps of introducing said substrate into a coating zone adjacent to said target, admitting a reaction gas in the immediate vicinity of the target, generating a plasma between said target and said substrate, said plasma containing material from said target, said material producing at least one spectral line, measuring the intensity of said spectral line, automatically sensing a property of the finished coating after said substrate leaves said coating zone and producing a sliding reference value which is continuously and automatically adjusted in relation to said property as sensed, regulating the admission of said reaction gas during the build-up of the coating according to the intensity of said spectral line and said sliding reference value so that a pre-established property of the finished coating is kept substantially constant, the time constant which represents the time lag between the measurement of the intensity and the admission of the reaction gas being kept to a minimum by the admission of the reaction gas in the immediate vicinity of the target.

2. Process according to claim 1, characterized in that the measurement of said intensity produces a signal that is amplified and electronically processed in a first control circuit and said time constant is equal to or less than 150 ms, and that the sliding reference value is determined by a second control circuit to which a signal obtained from said sensing of a coating property is fed.

3. Process according to claim 2, characterized in that said sensing of a coating property is performed outside of the coating zone and is fed to the second control circuit with a time constant equal to or greater than 0.5 sec.

4. Process according to claim 2, characterized in that an additional measurement signal is fed to the second control circuit, which signal is characteristic of the substrate properties before the coating process, and that the measurement signal from said sensing a property of the finished coating is compared with the additional measurement signal and the result of the comparison is used as a correction value for adjusting the sliding reference value.

5. Process according to claim 2, characterized in that the target surface is conditioned in preparation for the reactive deposit and then said regulating the admission of said reaction gas is accomplished by time-scheduling the flow of the reaction gas and steadily increasing it during a given adjustment time until the flow of the reaction gas is approximately the flow which will produce said pre-established property of the finished coating.

6. Process according to claim 5, characterized in that an actual value of the intensity signal is obtained at the end of the surface conditioning and the adjustment time and is compared with the signal obtained from the sensing of a coating property and on the basis of the comparison the sliding reference value is formed.

7. Process as in claim 1 wherein the time constant which represents the time lag between the measurement of the intensity and the admission of the gas is less than 150 ms.

8. Process as in claim 7 wherein the time constant is less than 50 ms.

9. Apparatus for controlling the reactive deposit of a coating on a substrate comprising
- a magnetron cathode having a target with an electrically conductive component of the coating material,
- a coating zone into which said substrate is introduced, said coating zone being adjacent to said target, said target and said substrate defining therebetween a reaction zone in which a plasma is generated,
- a gas distributing system comprising means for admitting a reaction gas in the immediate vicinity of said target, a source of reaction gas, and a control valve between said source and said admitting means,
- a first control circuit comprising a spectral photometer system having an optical sensor aimed at said reaction zone along a beam path parallel to said target, an amplifier connected to the output of said spectral photometer system, a controller, and an actuator for said control valve, said first control circuit having a relatively short time constant which represents the time lag between the measurement of the intensity and the admission of the gas,
- a second control circuit comprising a second sensor which automatically senses a property of the finished coating after the substrate leaves the coating zone, a second amplifier connected to said second sensor, and a reference value generator which produces a sliding reference value which is automatically adjusted in relation to the property of the finished coating sensed, said generator being connected to said controller, said second control circuit having a relatively long time constant which represents the time lag between the sensing of the property of the finished coating and the admission of the gas, the optical sensor and the second sensor producing signals which are combined by the controller to regulate said control valve so that a pre-established property of the finished coating is kept substantially constant.

10. Apparatus according to claim 9, wherein said second control circuit further comprises a third sensor disposed in the path of the substrate immediately in front of the coating station formed by the magnetron for sensing a property of the substrate entering the coating station, connected through a third amplifier to a microprocessor adapted to compare a property of the substrate entering the coating station with the property of the coated substrate sensed by the second sensor.

* * * * *